United States Patent [19]

Willis

[11] 4,445,536
[45] May 1, 1984

[54] ELECTRONIC-PNEUMATIC CIRCUIT BOARD COUPLING

[75] Inventor: John G. Willis, Chelmsford, Mass.

[73] Assignee: Linear Dynamics, Inc., East Pepperell, Mass.

[21] Appl. No.: 380,526

[22] Filed: May 21, 1982

[51] Int. Cl.³ .............................................. F16L 37/28
[52] U.S. Cl. ................................ 137/560; 251/149.7;
 285/119; 285/345; 339/35
[58] Field of Search ..................... 285/345, 331, 119;
 251/149.6, 149.7; 137/560; 339/35, 75 R

[56] References Cited

U.S. PATENT DOCUMENTS

| | | | |
|---|---|---|---|
| 207,432 | 8/1878 | Moffitt | 251/149.1 |
| 1,671,091 | 5/1928 | McGahey | 251/89.5 |
| 2,679,408 | 5/1954 | Jacob et al. | 137/237 |
| 3,608,570 | 9/1971 | McKhann | 251/149.6 |
| 3,673,541 | 6/1972 | Volinskie | 285/119 |
| 3,715,099 | 2/1973 | Schendure | 251/149.1 |
| 4,125,278 | 11/1978 | Hargraves | 285/423 |
| 4,214,552 | 7/1980 | Olander | 251/149.7 |
| 4,408,521 | 11/1983 | Schelli et al. | 285/119 |

FOREIGN PATENT DOCUMENTS 2350660 4/1975 Fed. Rep. of Germany ... 251/149.7

Primary Examiner—A. Michael Chambers
Attorney, Agent, or Firm—Sylvia L. Boyd

[57] ABSTRACT

There is disclosed a coupling for effecting pneumatic connection between a rack and a circuit board carrying both electrical and pneumatic control elements where concurrent connection is made of electric and pneumatic circuits as the circuit board is inserted in the rack. The coupling comprises a male unit with a wedge shaped insertion probe penetrated by a flow channel terminating in an interconnection port and a female unit with an opening for receiving the insertion probe of the male unit and an interconnection port mating across an interface surface with the male interconnection port. The female coupling unit further includes a shuttle with axial symmetry having an actuator shaft of a diameter to slide within the uniform bore portion of the tunnel at one end, a stop that cannot enter the uniform bore portion of the tunnel at the other end, two spaced apart seals of a diameter to make a sealing fit to the uniform bore portion of the tunnel positioned intermediately. The male coupling unit includes affixed thereto a projection positioned to engage the actuator shaft of the shuttle and as the coupling units are coupled press the shuttle against the biasing means in the proximal direction along the tunnel so that when the coupling units are fully coupled the shuttle is positioned with the proximal seal in the enlarged portion of the tunnel and the distal seal is positioned between the internal communicating channel and the proximal end of the tunnel.

1 Claim, 3 Drawing Figures

ELECTRONIC-PNEUMATIC CIRCUIT BOARD COUPLING

BACKGROUND OF THE INVENTION

This invention relates to couplings for effecting pneumatic connection between a rack and a circuit board carrying both electrical and pneumatic control elements.

Existing couplings when decoupled leave an open line which permit the escape of supply air.

SUMMARY OF THE INVENTION

The invention features a coupling for effecting pneumatic connection between a rack and a circuit board carrying both electrical and pneumatic control elements where concurrent connection is made of electric and pneumatic circuits as the circuit board is inserted in the rack. The coupling comprises a male unit with a wedge shaped insertion probe penetrated by a flow channel terminating in an interconnection port and a female unit with an opening for receiving the insertion probe of the male unit and an interconnection port mating across an interface surface with the male interconnection port. The interface surface between the male and female units is approximately parallel to the direction of motion as the male unit is inserted into the female unit. The female coupling unit has a tunnel passing therethrough, open at both ends, and oriented to be approximately parallel to the interface surface, the tunnel having a uniform bore in a region adjacent its distal end and having an enlarged bore near its proximal end. The tunnel has at its proximal end means for connection to a pneumatic channel, and the female coupling unit has an internal channel communicating between its interconnection port and the uniform bore portion of the tunnel. The female coupling unit further includes a shuttle with axial symmetry having an actuator shaft of a diameter to slide within the uniform bore portion of the tunnel at one end, a stop that cannot enter the uniform bore portion of the tunnel at the other end, two spaced apart seals of a diameter to make a sealing fit to the uniform bore portion of the tunnel positioned intermediately. A portion of the shuttle between the seals has a diameter less than that of the uniform bore portion of the tunnel, and the shuttle is, when the coupling is disengaged, positioned in the tunnel by biasing means with its actuator shaft extending out the distal end of the tunnel and both seals within and engaging the uniform bore portion of the tunnel, the proximal seal being positoned between the internal communicating channel and the enlarged bore portion of the tunnel, and the distal seal being positioned between the internal communicating channel and the distal end of the tunnel. The male coupling unit includes affixed thereto a projection positioned to engage the actuator shaft of the shuttle and as the coupling units are coupled press the shuttle against the biasing means in the proximal direction along the tunnel so that when the coupling units are fully coupled the shuttle is positioned with the proximal seal in the enlarged portion of the tunnel and the distal seal positioned between the internal communicating channel and the proximal end of the tunnel.

DESCRIPTION OF THE EMBODIMENT

Figure 1:
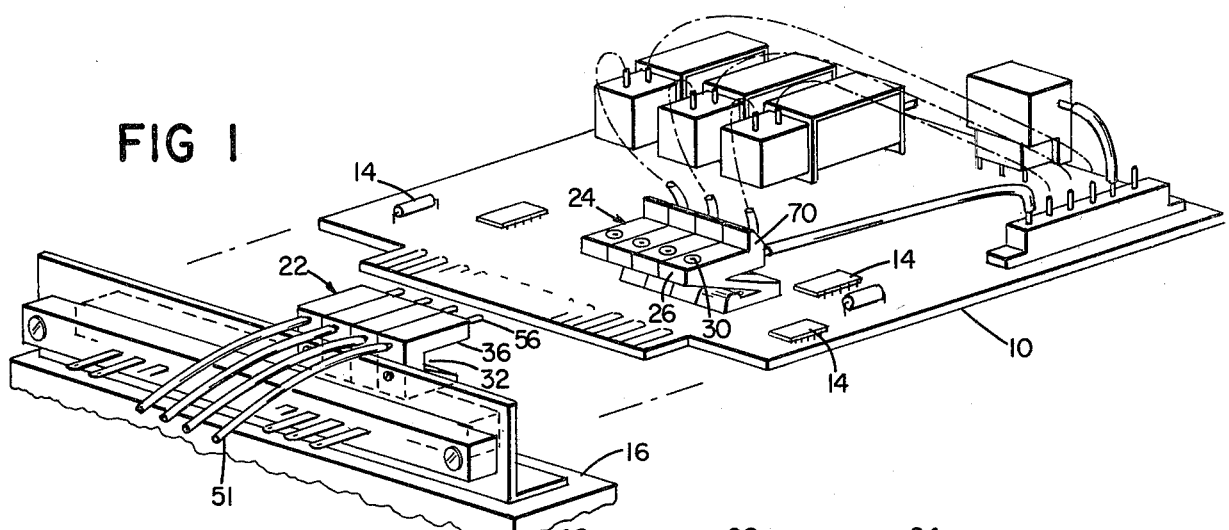
FIG. 1 shows a circuit board and a portion of a rack employing a coupling according to the invention.
Figure 2:
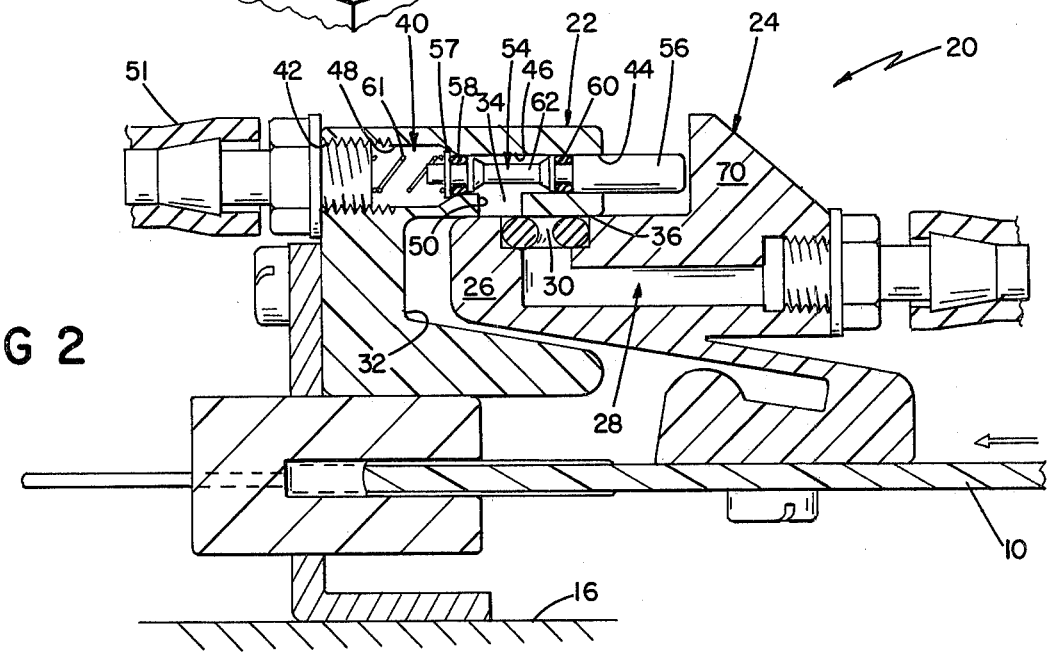
FIG. 2 shows a cross-sectional elevation view of the coupling employed in FIG. 1, the coupling being shown decoupled and in position to be coupled.
Figure 3:
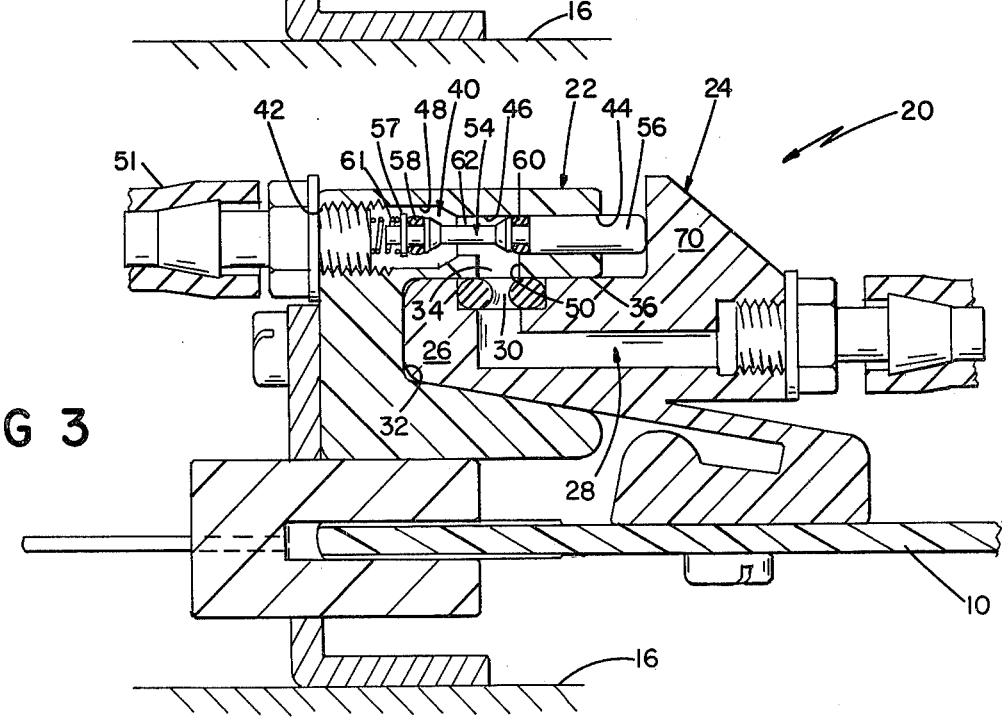
FIG. 3 shows the coupling of FIG. 2 in coupled position.

As shown in the Figures, circuit board 10 carries pneumatic control elements 12 and electrical control elements 14. Both electrical and pneumatic connections are made concurrently as board 10 is inserted into rack 16. Pneumatic coupling 20, shown more particularly in FIGS. 2 and 3, includes female unit 22 and male unit 24. Male unit 24 has a wedge shaped insertion probe 26 penetrated with a flow channel 28 terminating in interconnection port 30. Female unit 22 has an opening 32 for receiving probe 26 and a mating interconnecting port 34 mating with port 30 across interface surface 36 when coupling 20 is fully coupled as shown in FIG. 3. Interface surface 36 is oriented to be approximately parallel to the direction of motion of male unit 24 as it is inserted into female unit 22 to effect coupling, so that air pressure in the line during operation will not force the coupling to disengage.

Female unit 22 has additionally a tunnel 40 passing through it from proximal end 42 to distal end 44. Tunnel 40 has a uniform bore 46 in a region adjacent to distal end 44 and an enlarged bore 48 near proximal end 42. Internal channel 50 connects interconnecting port 34 with the uniform bore 46 of tunnel 40, and nipple 44 is connected to the proximal end 42 of tunnel 40 providing means for connection of a pneumatic supply channel 51.

Shuttle 54, having generally a cylindrically symmetric form, lies in tunnel 40. Shuttle 54 has at its distal end an actuator shaft 56 with a diameter to slide within the uniform bore 46 of tunnel 40, and at its proximal end a stop 57 which cannot enter uniform bore 46. Shuttle 54 includes proximal seal 58 and distal seal 60 positioned intermediately between stop 57 and shaft 56 and having diameters to make a sealing fit with uniform bore 46. A portion of shuttle 62 between seal 58 and seal 60 has a diameter less than that of uniform bore 46. Biasing spring 61 when coupling 20 is decoupled, positions shuttle 54 so that proximal seal 58 is within and in sealing contact with bore 46.

Male unit 24 includes projection 70 extending across the axis of shuttle 54 and positioned to engage actuator shaft 56 during insertion of male unit 24 into female unit 22.

OPERATION

The operation of the coupling is as follows. When decoupled, spring 61 pushes shuttle 54 distally until stop 57 engages because it cannot enter bore 46. In this position seal 58 lies within bore 46 and blocks flow of air between enlarged portion 48 and channel 50. As male unit 24 is thrust into female unit 22, projection 70 pushes the shuttle proximally so that when the coupling is effected by placing interconnection port 30 opposite port 34, seal 58 has been pushed out of bore 46 and air can flow from enlarged portion 48, alongside reduced section 62 and into internal channel 50 and thence to channel 28 in male unit 24. Seal 60 remains within bore 46 and seals against leakage out distal end 44.

What is claimed is:

1. In a coupling for effecting pneumatic connection between a rack and a circuit board carrying both electrical and pneumatic control elements where concurrent connection is made of electric and pneumatic circuits as the circuit board is inserted in the rack, the coupling comprising a male unit with a wedge shaped insertion probe penetrated by a flow channel terminating in an interconnection port and a female unit with an opening for receiving the insertion probe of the male unit and an interconnection port mating across an interface surface with the male interconnection port, the interface surface between the male and female units being approximately parallel to the direction of motion as the male unit is inserted into the female unit, the improvement wherein > said female coupling unit has a tunnel passing therethrough, open at both ends, and oriented to be approximately parallel to said interface surface, said tunnel having a uniform bore in a region adjacent its distal end and having an enlarged bore near its proximal end, said tunnel having at its proximal end means for connection to a pneumatic channel, said female coupling unit having an internal channel communicating between its interconnection port and the uniform bore portion of the tunnel,
>
> said female coupling unit including a shuttle with axial symmetry having an actuator shaft of a diameter to slide within the uniform bore portion of the tunnel at one end, a stop that cannot enter the uniform bore portion of the tunnel at the other end, two spaced apart seals of a diameter to make a sealing fit to the uniform bore portion of the tunnel positioned intermediately, a portion of the shuttle between the seals being of a diameter less than that of the uniform bore portion of the tunnel, said shuttle being, when the coupling is disengaged, positioned in said tunnel by biasing means with its actuator shaft extending out the distal end of the tunnel and both seals within and engaging the uniform bore portion of the tunnel, the proximal seal being positoned between the internal communicating channel and the enlarged bore portion of the tunnel, and the distal seal being positioned between the internal communicating channel and the distal end of the tunnel, and
>
> said male coupling unit including affixed thereto a projection positioned to engage the actuator shaft of the shuttle and as the coupling units are coupled press the shuttle against the biasing means in the proximal direction along the tunnel so that when the coupling units are fully coupled the shuttle is positioned with the proximal seal in the enlarged portion of the tunnel and the distal seal is positioned between the internal communicating channel and the proximal end of the tunnel.

* * * * *